United States Patent
Kishimoto et al.

(10) Patent No.: US 11,864,313 B2
(45) Date of Patent: Jan. 2, 2024

(54) MULTILAYER WIRING SUBSTRATE

(71) Applicant: Murata Manufacturing Co., Ltd., Nagaokakyo (JP)

(72) Inventors: Atsushi Kishimoto, Nagaokakyo (JP); Masatoshi Kakue, Nagaokakyo (JP); Shuichi Kawata, Nagaokakyo (JP); Hiroshi Nishikawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 87 days.

(21) Appl. No.: 17/368,905

(22) Filed: Jul. 7, 2021

(65) Prior Publication Data
US 2021/0337663 A1    Oct. 28, 2021

Related U.S. Application Data

(63) Continuation of application No. PCT/JP2019/046694, filed on Nov. 29, 2019.

(30) Foreign Application Priority Data

Jan. 31, 2019    (JP) ................. 2019-015481

(51) Int. Cl.
*H05K 1/02*    (2006.01)
*B32B 3/26*    (2006.01)
*B32B 9/00*    (2006.01)

(52) U.S. Cl.
CPC ........... *H05K 1/0298* (2013.01); *B32B 3/266* (2013.01); *B32B 9/007* (2013.01); *H05K 1/0207* (2013.01);

(Continued)

(58) Field of Classification Search
CPC .. H05K 1/0298; H05K 1/0206; H05K 1/0218; H05K 3/4641; H05K 2201/0209;
(Continued)

(56) References Cited

U.S. PATENT DOCUMENTS 4,812,792 A    3/1989    Leibowitz
2009/0321109 A1*    12/2009    Hwang .................. B82Y 10/00
                                                                    977/932

(Continued)

FOREIGN PATENT DOCUMENTS

JP    2018-008496 A    1/2018

OTHER PUBLICATIONS

Official Communication issued in International Patent Application No. PCT/JP2019/046694, dated Feb. 4, 2020.

*Primary Examiner* — Steven T Sawyer
(74) *Attorney, Agent, or Firm* — Keating & Bennett, LLP (57) ABSTRACT

A multilayer wiring substrate according to the present invention includes a dielectric base body, a signal line in or on the dielectric base body, a ground conductor in the dielectric base body, and a graphite sheet in the dielectric base body. The dielectric base body is a laminate including dielectric sheets stacked on top of each other. The ground conductor and the signal line face each other in a stacking direction of the dielectric sheets. The ground conductor overlaps the signal line when viewed in plan in the stacking direction. The graphite sheet and the signal line face each other in the stacking direction without the signal line being located between the graphite sheet and the ground conductor. An upper surface of the graphite sheet is coplanar with an upper surface of the ground conductor or is located below the upper surface of the ground conductor.

18 Claims, 5 Drawing Sheets

(52) U.S. Cl.
CPC ...... H05K 1/0218 (2013.01); *B32B 2307/202* (2013.01); *B32B 2307/204* (2013.01); *B32B 2457/08* (2013.01); *H05K 2201/0323* (2013.01); *H05K 2201/0723* (2013.01)

(58) Field of Classification Search
CPC ..... H05K 2201/066; H05K 2201/0723; H05K 2201/09309; H05K 2201/09672; H05K 2201/09781; H05K 1/0207; H05K 2201/0323; H05K 2201/06; B32B 3/266; B32B 9/007; B32B 2307/202; B32B 2307/204; B32B 2457/08
See application file for complete search history.

(56) References Cited

U.S. PATENT DOCUMENTS

| | | | |
|---|---|---|---|
| 2011/0014417 A1* | 1/2011 | Lemak | H01L 23/4006 427/407.1 |
| 2015/0084907 A1* | 3/2015 | Burberry | H05K 1/0296 345/174 |
| 2016/0381781 A1* | 12/2016 | Park | H05K 1/115 29/852 |
| 2017/0077069 A1* | 3/2017 | Danno | H01L 23/49575 |
| 2018/0146543 A1* | 5/2018 | Chen | H05K 1/05 |
| 2018/0256918 A1* | 9/2018 | Murakami | C04B 35/62218 |
| 2020/0223701 A1* | 7/2020 | Morikawa | B32B 27/306 |

* cited by examiner

MULTILAYER WIRING SUBSTRATE

CROSS REFERENCE TO RELATED APPLICATIONS

This application claims the benefit of priority to Japanese Patent Application No. 2019-015481 filed on Jan. 31, 2019 and is a Continuation Application of PCT Application No. PCT/JP2019/046694 filed on Nov. 29, 2019. The entire contents of each application are hereby incorporated herein by reference.

BACKGROUND OF THE INVENTION

1. Field of the Invention

The present invention relates to a multilayer wiring substrate.

2. Description of the Related Art

With the growing speed and complexity of signals and with a trend toward thinner substrates, there has been a demand for highly heat-dissipative substrates that find use as multilayer wiring substrates for processing radio-frequency signals.

Such a substrate is proposed in, for example, Japanese Unexamined Patent Application Publication No. 2018-8496, which discloses a metal-clad laminate including a conductor layer and an insulating layer on the conductor layer. The insulating layer includes a base material, a graphite sheet, and a guide member. The base material has electrical insulation properties. The graphite sheet and the guide member are embedded in the base material. The guide member of the metal-clad laminate disclosed in Japanese Unexamined Patent Application Publication No. 2018-8496 has a specific positional relationship with the graphite sheet and contains metal.

Japanese Unexamined Patent Application Publication No. 2018-8496 indicates that the graphite sheet disposed in the base material of the metal-clad laminate to enable dissipation of heat is less prone to breakage and that the guide member facilitates determining the position of the graphite sheet in the insulating layer.

There are, however, some downsides to the metal-clad laminate disclosed in Japanese Unexamined Patent Application Publication No. 2018-8496. Studies indicate that the metal-clad laminate used for a radio-frequency circuit creates the possibility that unintended circuit paths will be formed between the conductor layer and the graphite sheet and will cause failure to obtain desired characteristics. There may be several reasons: stray capacitance arises between the conductor layer and the graphite sheet; and the graphite sheet in itself acts as a resistor. It is also found that when the metal-clad laminate disclosed in Japanese Unexamined Patent Application Publication No. 2018-8496 is used for a radio-frequency circuit, the graphite sheet in the metal-clad laminate may resonate and may, in turn, produces noise.

SUMMARY OF THE INVENTION

Preferred embodiments of the present invention provide multilayer wiring substrates that each include graphite sheets to enable dissipation of heat to significantly reduce the possibility of a failure to provide desired characteristics.

A multilayer wiring substrate according to a preferred embodiment of the present invention includes a dielectric base body, a signal line in or on the dielectric base body, a ground conductor in the dielectric base body, and a graphite sheet in the dielectric base body. The dielectric base body is a laminate including a plurality of dielectric sheets stacked on top of each other. The ground conductor and the signal line face each other in a stacking direction of the plurality of dielectric sheets. The ground conductor overlaps the signal line when viewed in plan in the stacking direction. The graphite sheet and the signal line face each other in the stacking direction without the signal line being located between the graphite sheet and the ground conductor. With the signal line on an upper side in the stacking direction and the ground conductor on a lower side in the stacking direction, an upper surface of the graphite sheet is coplanar with an upper surface of the ground conductor or is located below the upper surface of the ground conductor.

The multilayer wiring substrates according to preferred embodiments of the present invention each include the graphite sheets to enable dissipation of heat to reduce the possibility of a failure to provide desired characteristics.

The above and other elements, features, steps, characteristics, and advantages of the present invention will become more apparent from the following detailed description of the preferred embodiments with reference to the attached drawings.

DETAILED DESCRIPTION OF THE PREFERRED EMBODIMENTS

The following describes multilayer wiring substrates according to preferred embodiments of the present invention.

The following should not be construed as limiting the configuration of the present invention, which may be modified as appropriate within a range not changing the gist of the present invention. It should be noted that varying combinations of two or more preferred embodiments, which will be described below, are also embraced by the present invention.

A multilayer wiring substrate according to a preferred embodiment of the present invention includes a dielectric base body, a signal line in or on the dielectric base body, a ground conductor in the dielectric base body, and a graphite sheet in the dielectric base body. The dielectric base body is a laminate including dielectric sheets stacked on top of each other. The ground conductor and the signal line face each other in a stacking direction of the dielectric sheets. The ground conductor overlaps the signal line when viewed in plan in the stacking direction. The graphite sheet and the signal line face each other in the stacking direction without the signal line being located between the graphite sheet and the ground conductor.

In the multilayer wiring substrate according to the present preferred embodiment of the present invention, with the signal line on an upper side in the stacking direction and the ground conductor on a lower side in the stacking direction, an upper surface of the graphite sheet is coplanar with an upper surface of the ground conductor or is located below the upper surface of the ground conductor.

The graphite sheet in the dielectric base body enables an improvement in the thermal dissipation properties of the multilayer wiring substrate. This involves providing intended circuit paths between the signal line and the ground conductor and providing a graphite sheet that is of high resistance and is farther than the ground conductor from the signal line. This layout prevents penetration of an electric field from the signal line into the graphite sheet such that there is substantially no capacitive component. This feature eliminates or reduces the possibility that unintended circuit paths will be formed between the signal line and the graphite sheet and that desired characteristics are not provided. With the graphite sheet being located farther than the ground conductor from the signal line, the resonance of the graphite sheet is suppressed, and noise is suppressed accordingly.

The preferred embodiments described herein are merely examples. Partial replacements or combinations of configurations illustrated in different preferred embodiments are possible. Redundant description of features common to a first preferred embodiment and another preferred embodiment will be omitted, and a second preferred embodiment and a subsequent preferred embodiment will be described with regard to only their distinctive features. This is particularly true for advantageous actions and effects. That is, not every preferred embodiment refers to advantageous actions and effects caused by similar configurations.

First Preferred Embodiment

In a first preferred embodiment of the present invention, the upper surface of the graphite sheet is located below the lower surface of the ground conductor.

Figure 1:
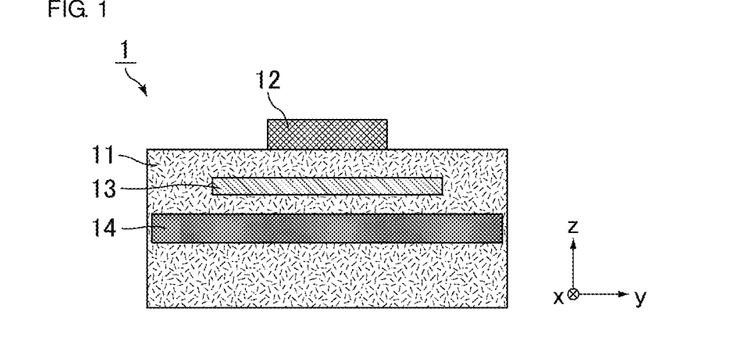
FIG. 1 is a sectional view of an example of a multilayer wiring substrate according to a first preferred embodiment of the present invention.

FIG. 1 is a sectional view of an example of the multilayer wiring substrate according to the first preferred embodiment of the present invention.

Figure 2A:
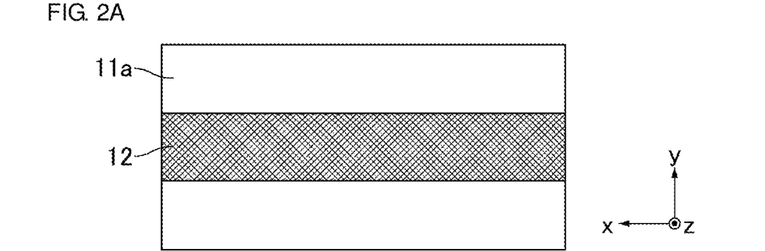
FIGS. 2A to 2C are exploded plan views of the multilayer wiring substrate illustrated in FIG. 1.
Figure 2B:
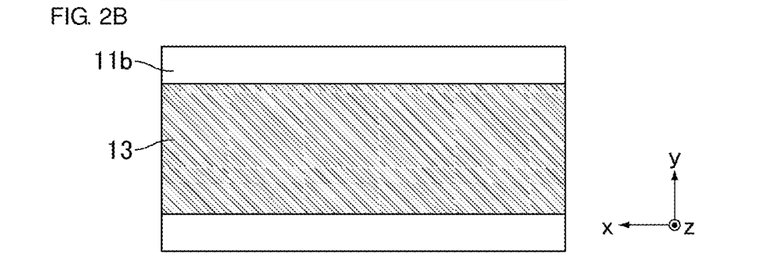
Figure 2C:
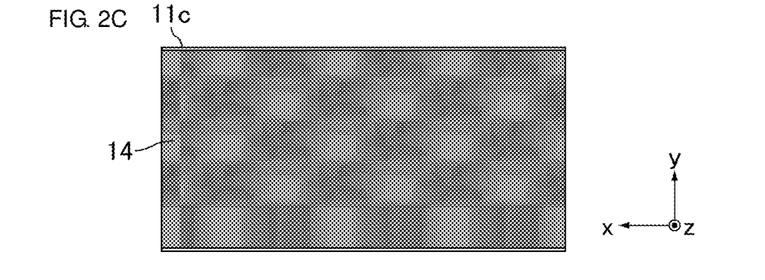

FIGS. 2A to 2C are exploded plan views of the multilayer wiring substrate illustrated in FIG. 1.

Referring to FIGS. 1 and 2A to 2C, which illustrate a multilayer wiring substrate 1, the direction of the x axis coincides with the direction of the length of the multilayer wiring substrate 1 (i.e., longitudinal direction), the direction of the y axis coincides with the direction of the width of the multilayer wiring substrate 1 (i.e., width direction), and the direction of the z axis coincides with the direction in which layers included in the multilayer wiring substrate 1 are stacked (i.e., stacking direction). The longitudinal direction, the width direction, and the stacking direction are orthogonal to one another. Components illustrated in FIG. 1 are not drawn to scale. That is, the thickness of each component in FIG. 1 is changed as appropriate for greater clarity and simplification. The other drawings described herein are also not drawn to scale, and may illustrate components that are similarly changed for greater clarity and simplification.

Referring to FIG. 1, the multilayer wiring substrate 1 includes a dielectric base body 11, a signal line 12, a ground conductor 13, and a graphite sheet 14. The signal line 12 is provided on a surface of the dielectric base body 11, and the ground conductor 13 and the graphite sheet 14 are provided in the dielectric base body 11.

The dielectric base body 11 is a laminate including a dielectric sheet 11a (see FIG. 2A), a dielectric sheet 11b (see FIG. 2B), and a dielectric sheet 11c (see FIG. 2C), which are provided in this order in the direction from the positive side to the negative side in the direction of the z axis and are bonded together by pressure bonding. The dielectric sheets 11a, 11b, and 11c each have a principal surface (front surface) on the positive side in the direction of the z axis and a principal surface (back surface) on the negative side in the direction of the z axis.

The signal line 12 is provided on the front surface of the dielectric sheet 11a as illustrated in FIG. 2A, thus being located on the surface of the dielectric base body 11. The signal line 12 is a linear conductor and extends in the direction of the x axis on the front surface of the dielectric sheet 11a.

As illustrated in FIG. 1, the ground conductor 13 is provided on the negative side in the direction of the z axis with respect to the signal line 12, and the ground conductor 13 and the signal line 12 face each other in the direction of the z axis, that is, in the stacking direction.

The ground conductor 13 is provided on the front surface of the dielectric sheet 11b as illustrated in FIG. 2B, thus being located in the dielectric base body 11. The ground conductor 13 extends in the direction of the x axis on the front surface of the dielectric sheet 11b. The area of the ground conductor 13 is greater than the area of the signal line 12. The ground conductor 13 thus overlaps the signal line 12 when viewed in plan in the direction of the z axis, that is, in the stacking direction.

As illustrated in FIG. 1, the graphite sheet 14 is provided on the negative side in the direction of the z axis with respect to the signal line 12, and the graphite sheet 14 and the signal line 12 face each other in the direction of the z axis, that is, in the stacking direction, without the signal line 12 being located between the graphite sheet 14 and the ground conductor 13.

The graphite sheet 14 is provided on the front surface of the dielectric sheet 11c as illustrated in FIG. 2C, thus being located in the dielectric base body 11. The graphite sheet 14 extends over substantially an entirety of the front surface of the dielectric sheet 11c.

The signal line 12 is located on one side (upper side) in the stacking direction, and the ground conductor 13 is located on the other side (lower side) in the stacking direction. In other words, the positive side in the direction of the z axis is herein referred to as the upper side, and the negative side in the direction of the z axis is herein referred to as the lower side. The signal line 12, the ground conductor 13, and the graphite sheet 14 each have a principal surface (upper surface) on the upper side and a principal surface (lower surface) on the lower side.

The expressions "upper . . . " and "lower . . . " are used herein to describe the relative orientation in or on the multilayer wiring substrate and are not used as synonymous with "vertically upward" and "vertically downward", respectively.

Referring to FIG. 1, which illustrates the multilayer wiring substrate 1, the upper surface of the graphite sheet 14 is located below the upper surface of the ground conductor 13. More specifically, the upper surface of the graphite sheet 14 is located below the lower surface of the ground conductor 13.

Although the upper surface of the graphite sheet is located below the lower surface of the ground conductor, the spacing between the upper surface of the graphite sheet and the lower surface of the ground conductor is not limited to a particular value. An increase in the spacing between the upper surface of the graphite sheet and the lower surface of the ground conductor increases the overall thickness of the substrate. The increase in the spacing between the upper surface of the graphite sheet and the lower surface of the ground conductor may cause the overall capacitance of the wiring substrate to become unstable, and thus it may be difficult to provide desired characteristics. In this respect, the spacing between the upper surface of the graphite sheet and the lower surface of the ground conductor is preferably equal to or less than about 300% of the spacing between the upper surface of the ground conductor and the lower surface of the signal line and is preferably equal to or more than about 20% of the spacing, for example. The spacing between the upper surface of the graphite sheet and the lower surface of the ground conductor may be zero or substantially zero.

Dielectric Sheets

The dielectric sheets defining the dielectric base body may, for example, be made from a resin material or a ceramic material. The dielectric sheets are preferably flexible, for example.

Ceramic materials that may be used as the material of the dielectric sheets include, for example, low-temperature co-fired ceramic (LTCC) materials. Ceramic materials that can be fired at or below about 1,000° C. and can be co-fired with metal such as copper or silver are known as the LTCC materials, for example.

Examples of the LTCC materials include glass composite LTCC materials each including a mixture of borosilicate glass and a ceramic material, such as quartz, alumina, or forsterite; crystallized glass LTCC materials each including $ZnO$—$MgO$—$Al_2O_3$—$SiO_2$ crystallized glass; and non-glass LTCC materials each including a $BaO$—$Al_2O_3$—$SiO_2$ ceramic material or an $Al_2O_3$—$CaO$—$SiO_2$—$MgO$—$B_2O_3$ ceramic material.

Examples of the resin material include liquid crystal polymer (LCP), thermoplastic polyimide resin, polyetherketone (PEEK) resin, polyphenylene sulfide (PPS) resin, polytetrafluoroethylene (PTFE) resin, and glass epoxy resin. The resin material may be a thermoplastic resin or a thermosetting resin and is preferably a thermoplastic resin such as LCP, for example. The dielectric sheets made from a thermoplastic resin may be bonded together without an adhesive layer therebetween.

Signal Line and Ground Conductor

The signal line and the ground conductor may be similar to a known wiring substrate.

Examples of the material of the signal line and the ground conductor include copper (Cu), silver (Ag), aluminum (Al), nickel (Ni), gold (Au), and alloys of these metals. Among these metals and alloys of these metals, copper is particularly preferred, for example. The signal line and the ground conductor are preferably made of conductive foil, particularly preferably copper foil, for example.

Graphite Sheet

The graphite sheet is provided by forming graphite into a sheet. The upper surface and the lower surface of the graphite sheet are each preferably not exposed at a surface of the dielectric base body as illustrated in FIG. 1, for example. That is, the upper surface and the lower surface of the graphite sheet are preferably located within the dielectric base body, for example. The graphite sheet embedded in the dielectric base body is less prone to breakage. A signal line and a ground conductor may be located on one side, and another signal line and another ground conductor may be located on the other side, with the graphite sheet being embedded in the dielectric base body and located between the signal lines and between the ground conductors.

The graphite sheet is preferably, for example, a graphene sheet including layers of graphene stacked on top of each other and held together by van der Waals forces. Graphene has a planar structure where carbon atoms are arranged in a hexagonal mesh. The graphene sheet preferably has a layered structure where its in-plane directions (XY plane) are orthogonal to its thickness direction (Z direction), for example. According to this structure, the thermal conductivity of the graphite sheet is greater in the in-plane directions than in the thickness direction.

The thickness of the graphite sheet is not limited to a particular value and is preferably equal to or more than about 10 μm and more preferably equal to or more than about 20 μm, for example. Furthermore, the thickness of the graphite sheet is preferably equal to or less than about 200 μm, more preferably equal to or less than about 100 μm, and still more preferably equal to or less than about 80 μm, for example.

The average of values of the thickness measured at freely selected ten points on the graphite sheet is taken as the thickness of the graphite sheet.

The thermal conductivity in the in-plane directions of the graphite sheet is not limited to a particular value and is preferably equal to or more than about 700 W/mk, more preferably equal to or more than about 1,000 W/mk, still more preferably equal to or more than about 1,500 W/mk, and particularly preferably equal to or more than about 1,800 W/mk, for example.

The thermal conductivity in the in-plane directions of the graphite sheet is able to be determined by Equation (1):

$$A = \alpha \times d \times Cp \quad (1)$$

In Equation (1), A denotes the thermal conductivity of the graphite sheet, $\alpha$ denotes the thermal diffusivity of the graphite sheet, d denotes the density of the graphite sheet, and Cp denotes the specific heat capacity of the graphite sheet.

The thermal diffusivity of the graphite sheet may be determined, for example, as follows. A sample piece that measures about 50 mm by about 50 mm is cut out of the graphite sheet, and measurement is conducted on the sample piece in an atmosphere at about 25° C. by means of a laser spot periodic heating radiation thermometry method, using a thermal diffusivity measurement device (e.g., Thermowave Analyzer TA manufactured by Bethel Co., Ltd).

The density of the graphite sheet may be determined, for example, as follows. A sample piece that measures about 50 mm by about 50 mm is cut out of the graphite sheet, and a weight measurement obtained by measurement on the sample piece is divided by the volume (determined by calculation: 50 mm×50 mm×a thickness measurement obtained by measurement on the sample piece).

The specific heat capacity of the graphite sheet may be determined, for example, by using a differential scanning calorimeter (e.g., DSC Q2000 manufactured by TA Instruments) under the condition where the temperature is raised from about 20° C. to about 260° C. at a rate of about 10° C./min.

The electrical conductivity of the graphite sheet is not limited to a particular value and is preferably equal to or more than about 7,000 S/cm, more preferably equal to or more than about 10,000 S/cm, still more preferably equal to or more than about 13,000 S/cm, and particularly preferably equal to or more than about 18,000 S/cm, for example. Furthermore, the electrical conductivity of the graphite sheet is preferably equal to or less than about 25,000 S/cm and more preferably equal to or less than about 20,000 S/cm, for example.

The electrical conductivity of the graphite sheet may be determined by means of the four-probe method, in which a constant current is applied by using, for example, Loresta-GP manufacture by Mitsubishi Chemical Analytech Co., Ltd.

The density of the graphite sheet is not limited to a particular value and is preferably equal to or more than about 0.8 g/cm$^3$ and more preferably equal to or more than about 1.8 g/cm$^3$, for example. Furthermore, the density of the graphite sheet is preferably equal to or less than about 2.2 g/cm$^3$, for example.

Examples of commercially available graphite sheets that may be adopted include GRAPHINITY manufactured by Kaneka Corporation and PGS (registered trademark) manufactured by Panasonic Corporation.

The multilayer wiring substrate according to the first preferred embodiment of the present invention may be produced by following non-limiting example procedure below.

Although the following describes an example procedure by which one multilayer wiring substrate 1 (see FIG. 1) is produced, more than one multilayer wiring substrate 1 may be produced at the same time by forming a laminate of large dielectric sheets layered on top of each other and by cutting the laminate into a plurality of wiring substrates.

In a preparatory step, the dielectric sheet 11a having conductive foil (e.g., copper foil) stuck on its surface is provided. The dielectric sheet may, for example, be made from the above-mentioned liquid crystal polymer. The signal line 12 (see FIG. 2A) is then formed on the surface of the dielectric sheet 11a. More specifically, a photoresist that is of identical or substantially identical shape with the signal line 12 illustrated in FIG. 2A is formed on the conductive foil on the dielectric sheet 11a by a process referred to as photolithography, for example. The conductor foil is etched to remove regions that are not covered with the photoresist. The photoresist is then removed. The signal line 12 is formed on the surface of the dielectric sheet 11a.

In the preparatory step, the dielectric sheet 11b with a conductive foil (e.g., copper foil) stuck on its surface is also provided. The ground conductor 13 (see FIG. 2B) is then formed on the surface of the dielectric sheet 11b by photolithography. The ground conductor 13 is formed by photolithography similar to the signal line 12 being formed by photolithography.

In the preparatory step, the dielectric sheet 11c including the graphite sheet 14 stuck on its surface is also provided.

The dielectric sheet 11a including the signal line 12 formed thereon, the dielectric sheet 11b including the ground conductor 13 formed thereon, and the dielectric sheet 11c overlaid with the graphite sheet 14 are in this order and are bonded together into a laminate by application of heat. Accordingly, the multilayer wiring substrate 1 illustrated in FIG. 1 is provided.

The multilayer wiring substrate according to the first preferred embodiment of the present invention may also include an electronic component mounted on the dielectric base body. The electronic component is preferably connected to the graphite sheet with a thermal via extending therebetween, for example. The electronic component included in the multilayer wiring substrate is preferably an active component connected to the graphite sheet with a thermal via extending therebetween, for example.

The electronic component may be either an active component or a passive component. Alternatively, the electronic component may be a combination of an active component and a passive component.

The active component may be, for example, a semiconductor device such as a transistor, a diode, an integrated circuit (IC), or a large-scale integrated circuit (LSI). The passive component may be, for example, a component in chip form (e.g., a resistor or a capacitor), a resonator (oscillator), or a filter.

Figure 3:
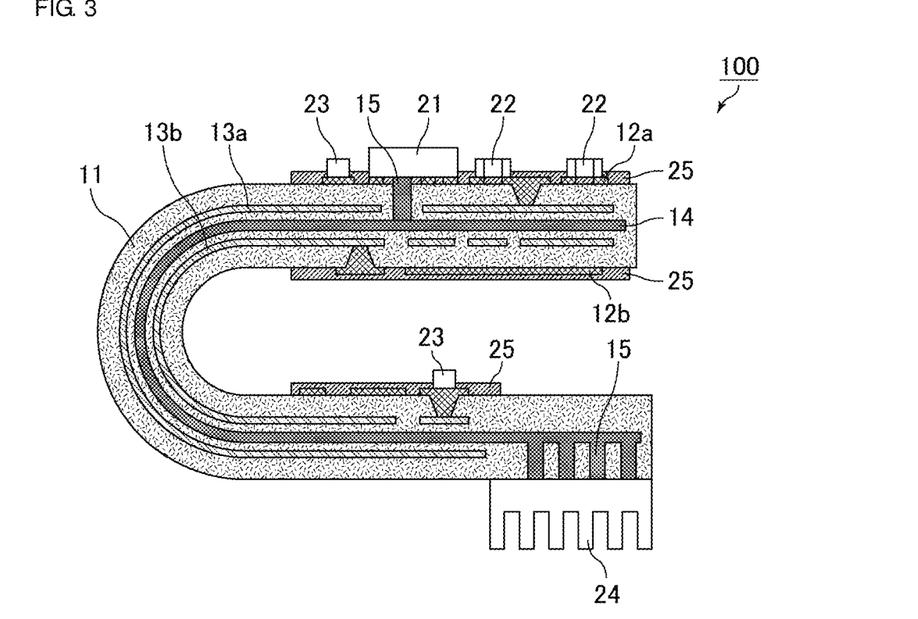
FIG. 3 is a sectional view of an example of the multilayer wiring substrate according to the first preferred embodiment of the present invention.

FIG. 3 is a sectional view of a concrete example of the multilayer wiring substrate according to the first preferred embodiment of the present invention.

Referring to FIG. 3, a multilayer wiring substrate 100 is a flexible substrate and includes a dielectric base body 11, a signal line 12a, a signal line 12b, a ground conductor 13a, a ground conductor 13b, and a graphite sheet 14. The signal line 12a and the ground conductor 13a are closer than the graphite sheet 14 to one principal surface of the dielectric base body 11, and the signal line 12b and the ground conductor 13b are closer than the graphite sheet 14 to the other principal surface of the dielectric base body 11.

With the signal line 12a on the upper side in the stacking direction and the ground conductor 13a on the lower side in the stacking direction, the upper surface of the graphite sheet 14 is located below the upper surface of the ground conductor 13a. More specifically, the upper surface of the graphite sheet 14 is located below the lower surface of the ground conductor 13a.

With the signal line 12b on the upper side in the stacking direction and the ground conductor 13b on the lower side in the stacking direction, the upper surface of the graphite sheet 14 is located below the upper surface of the ground conductor 13b. More specifically, the upper surface of the graphite sheet 14 is located below the lower surface of the ground conductor 13b.

Referring to FIG. 3, which illustrates the multilayer wiring substrate 100, electronic components, or more specifically, an active component 21 and passive components 22 are mounted on the one principal surface of the dielectric base body 11. The active component 21 is connected to the graphite sheet 14 with a thermal via 15 extending therebetween.

The dielectric base body 11 is provided with connectors 23, which are mounted on the respective principal surfaces of the dielectric base body 11. In addition, a heat-dissipating member 24 may be mounted on the one principal surface of the dielectric base body 11. The heat-dissipating member 24 is connected to the graphite sheet 14 with thermal vias 15 extending therebetween. The heat-dissipating member 24 may, for example, be a heat sink or a housing.

Referring to FIG. 3, the multilayer wiring substrate 100 also includes protective layers 25, which protect the signal lines 12a and 12b. The protective layers 25 may, for example, be cover-lay films or solder resist films. The protective layers 25 are provided on the respective principal surfaces of the dielectric base body 11. Alternatively, one protective layer 25 may be provided on either of the two principal surfaces. The protective layers 25 are optional; that is, it is not required that the protective layers 25 be provided on the principal surfaces of the dielectric base body 11.

Second Preferred Embodiment

The following describes a second preferred embodiment of the present invention, in which at least a portion of the upper surface of the graphite sheet is in contact with the ground conductor.

Figure 4:
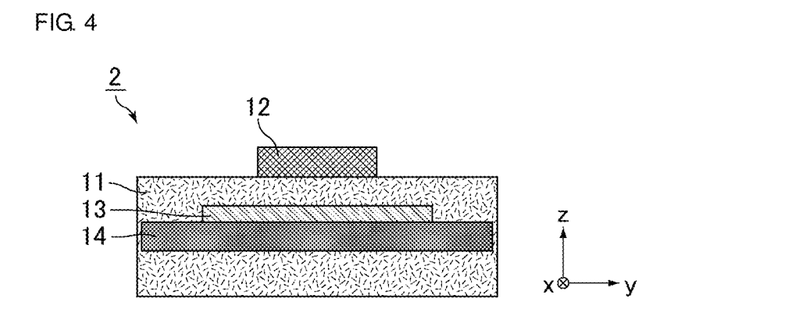
FIG. 4 is a sectional view of an example of a multilayer wiring substrate according to a second preferred embodiment of the present invention.

FIG. 4 is a sectional view of an example of the multilayer wiring substrate according to the second preferred embodiment of the present invention.

Figure 5A:
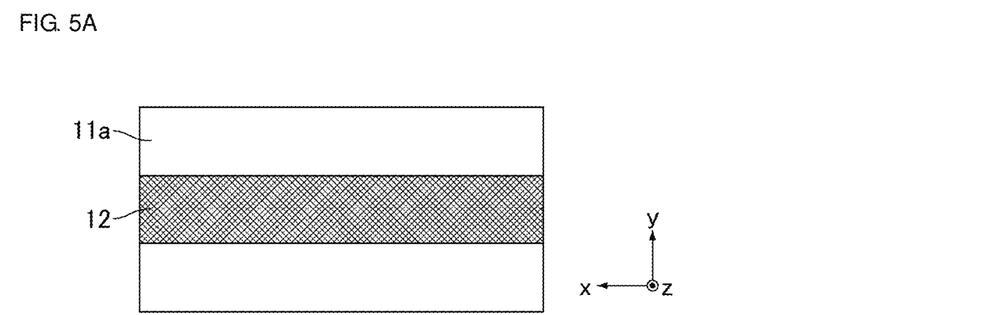
FIGS. 5A and 5B are exploded plan views of the multilayer wiring substrate illustrated in FIG. 4.
Figure 5B:
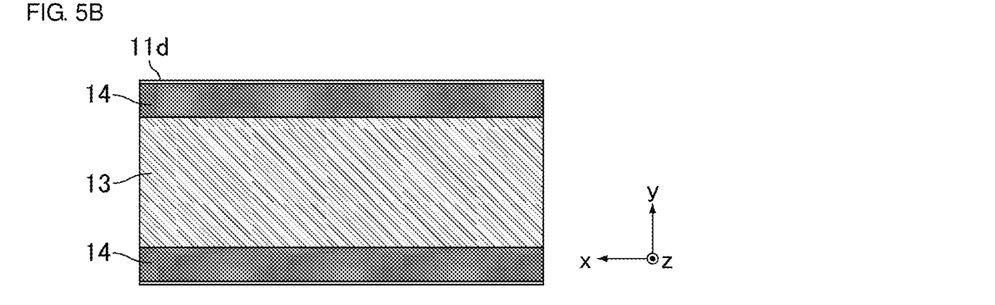

FIGS. 5A and 5B are exploded plan views of the multilayer wiring substrate illustrated in FIG. 4.

Referring to FIG. 4, a multilayer wiring substrate 2 includes a dielectric base body 11, a signal line 12, a ground conductor 13, and a graphite sheet 14. The signal line 12 is provided on a surface of the dielectric base body 11, and the ground conductor 13 and the graphite sheet 14 are provided in the dielectric base body 11.

The dielectric base body 11 includes a dielectric sheet 11a (see FIG. 5A) and a dielectric sheet 11d (see FIG. 5B), which are in this order in the direction from the positive side to the negative side in the direction of the z axis and are bonded together into a laminate by pressure bonding.

The signal line 12 is provided on a front surface of the dielectric sheet 11a as illustrated in FIG. 5A, thus being located on the surface of the dielectric base body 11.

The graphite sheet 14 is provided on the front surface of the dielectric sheet 11d as illustrated in FIG. 5B, thus being located in the dielectric base body 11. The graphite sheet 14 extends over an entirety or substantially an entirety of the front surface of the dielectric sheet 11d.

The ground conductor 13 is provided on the surface of the graphite sheet 14 as illustrated in FIG. 5B, thus being located in the dielectric base body 11.

Referring to FIG. 4, which illustrates the multilayer wiring substrate 2, the upper surface of the graphite sheet 14 is located below the upper surface of the ground conductor 13. The upper surface of the graphite sheet 14 is coplanar with the lower surface of the ground conductor 13, and a portion of the upper surface of the graphite sheet 14 is in contact with the lower surface of the ground conductor 13.

The second preferred embodiment of the present invention differs from the first preferred embodiment of the present invention in that the ground conductor and the graphite sheet of the multilayer wiring substrate are in contact with each other, thus enabling a reduction in the overall thickness of the substrate. The second preferred embodiment differs from the first preferred embodiment also in that the ground conductor and the graphite sheet face each other with no portion of the dielectric base body therebetween, and thus desired characteristics are able to be easily provided. The second preferred embodiment also differs from a third preferred embodiment, which will be described later, in that the area of the graphite sheet does not depend on the area of the ground conductor, thus enabling the multilayer wiring substrate to provide enhanced heat dissipation effect.

Figure 6:
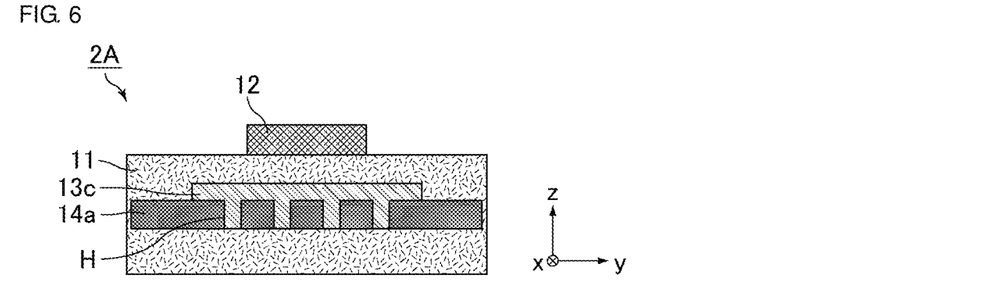
FIG. 6 is a sectional view of another example of the multilayer wiring substrate according to the second preferred embodiment of the present invention.

FIG. 6 is a sectional view of another example of the multilayer wiring substrate according to the second preferred embodiment of the present invention.

Referring to FIG. 6, a multilayer wiring substrate 2A includes a graphite sheet 14a and a ground conductor 13c. The graphite sheet 14a includes through-holes H, which extend in the direction of the z axis, that is, in the stacking direction. The through-holes H are filled with a portion of the ground conductor 13c. The upper surface of the ground conductor 13c is located above the upper surface of the graphite sheet 14a and is in contact with the dielectric base body 11. A portion of the lower surface of the ground conductor 13c is coplanar with the lower surface of the graphite sheet 14a and is in contact with the dielectric base body 11. The remainder of the lower surface of the ground conductor 13c is coplanar with the upper surface of the graphite sheet 14a and is in contact with a portion of the upper surface of the graphite sheet 14a.

Figure 7:
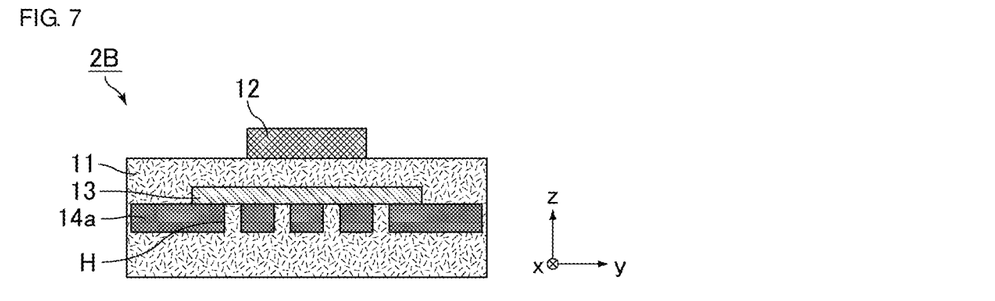
FIG. 7 is a sectional view of a multilayer wiring substrate that is a modification of the multilayer wiring substrate illustrated in FIG. 6.

FIG. 7 is a sectional view of a multilayer wiring substrate that is a modification of the multilayer wiring substrate illustrated in FIG. 6.

Referring to FIG. 7, which illustrates a multilayer wiring substrate 2B, the ground conductor 13 is provided on the upper surface of the graphite sheet 14a including the through-holes H. The multilayer wiring substrate 2B differs from the multilayer wiring substrate 2A illustrated in FIG. 6 in that the through-holes H are filled with a portion of the dielectric base body 11 instead of being filled with a portion of the ground conductor 13. The lower surface of the ground conductor 13 is coplanar with the upper surface of the graphite sheet 14a and is in contact with a portion of the upper surface of the graphite sheet 14a and with the dielectric base body 11.

Figure 8:
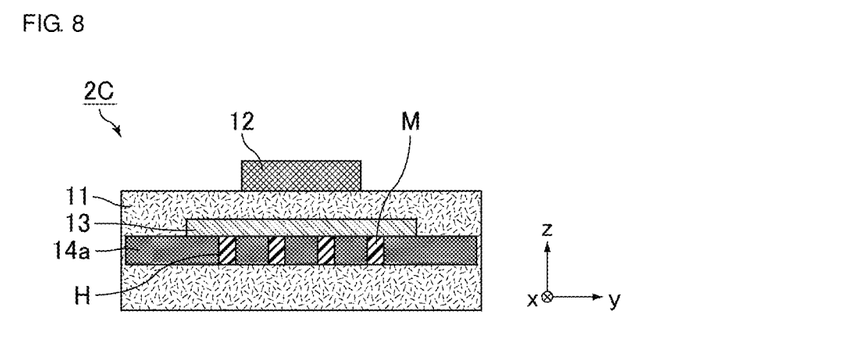
FIG. 8 is a sectional view of a multilayer wiring substrate that is another modification of the multilayer wiring substrate illustrated in FIG. 6.

FIG. 8 is a sectional view of a multilayer wiring substrate that is another modification of the multilayer wiring substrate illustrated in FIG. 6.

Referring to FIG. 8, which illustrates a multilayer wiring substrate 2C, the through-holes H in the graphite sheet 14a are filled with metal M, and the ground conductor 13 is provided on the upper surface of the graphite sheet 14a. The metal M may, for example, be copper. The ground conductor 13 is jointed to the metal M. The lower surface of the ground conductor 13 is coplanar with the upper surface of the graphite sheet 14a and is in contact with a portion of the upper surface of the graphite sheet 14a and with the metal M.

Figure 9:
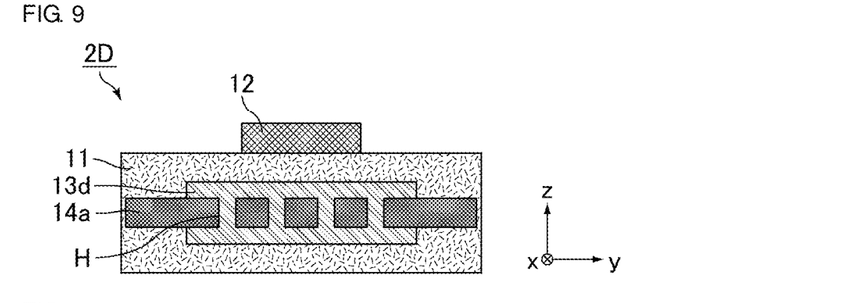
FIG. 9 is a sectional view of another example of the multilayer wiring substrate according to the second preferred embodiment of the present invention.

FIG. 9 is a sectional view of still another example of the multilayer wiring substrate according to the second preferred embodiment of the present invention.

Referring to FIG. 9, which illustrates a multilayer wiring substrate 2D, the through-holes H of the graphite sheet 14a are filled with a portion of a ground conductor 13d. The upper surface of the ground conductor 13d is located above the upper surface of the graphite sheet 14a and is in contact with the dielectric base body 11. The lower surface of the ground conductor 13d is located below the lower surface of the graphite sheet 14a and is in contact with the dielectric base body 11. The graphite sheet 14a of the multilayer wiring substrate 2D illustrated in FIG. 9 is provided in the ground conductor 13d, with a portion of the upper surface and a portion of the lower surface of the graphite sheet 14a being in contact with the ground conductor 13d.

The multilayer wiring substrate according to the second preferred embodiment of the present invention may include the structure illustrated in FIG. 6 or the structure illustrated in FIG. 9, in which the graphite sheet includes through-holes extending in the stacking direction and filled with a portion of the ground conductor, with at least a portion of the lower surface of the ground conductor being in contact with the dielectric base body.

The ground conductor and the graphite sheet that are fixedly held in the dielectric base body provide added mechanical strength to the multilayer wiring substrate.

The through-holes in the graphite sheet of the multilayer wiring substrate according to the second preferred embodiment of the present invention are not limited in size and number, and the arrangement of the through-holes is not limited.

The ground conductor and the graphite sheet of the multilayer wiring substrate according to the second preferred embodiment of the present invention may be bonded together with, for example, a brazing filler metal therebetween to increase the adhesion between the ground conductor and the graphite sheet.

The multilayer wiring substrate according to the second preferred embodiment of the present invention may be produced in the same or similar manner as the multilayer wiring substrate according to the first preferred embodiment of the present invention.

The multilayer wiring substrate 2 illustrated in FIG. 4 may, for example, be produced as follows. The dielectric sheet 11a including the signal line 12 formed thereon and the dielectric sheet 11d overlaid with the graphite sheet 14 including the ground conductor 13 formed thereon are in this order and bonded together into a laminate by application of heat.

The multilayer wiring substrate according to the second preferred embodiment of the present invention may also include an electronic component mounted on the dielectric base body. The electronic component is preferably connected to the ground conductor with a conductor via extending therebetween, for example. The electronic component included in the multilayer wiring substrate is preferably an active component connected to the ground conductor with a conductor via extending therebetween, for example.

The ground conductor and the graphite sheet of the multilayer wiring substrate according to the second preferred embodiment of the present invention are in contact with each other such that heat generated by the electronic component connected to the ground conductor is transferred to the graphite sheet having high thermal conductivity. The conductor via may double as a signal path for transmission of signals to the ground conductor.

Figure 10:
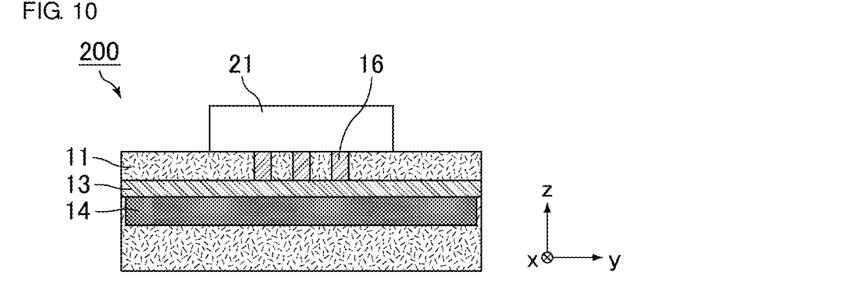
FIG. 10 is a sectional view of an example of a multilayer wiring substrate with an electronic component connected to a ground conductor of the multilayer wiring substrate.

FIG. 10 is a sectional view of an example of the multilayer wiring substrate with an electronic component connected to the ground conductor of the multilayer wiring substrate.

Referring to FIG. 10, which illustrates a multilayer wiring substrate 200, an electronic component, or more specifically, an active component 21 is mounted on a principal surface of the dielectric base body 11. The active component 21 is connected to the ground conductor 13 with conductor vias 16 extending therebetween.

Third Preferred Embodiment

In a third preferred embodiment of the present invention, the upper surface of the graphite sheet is coplanar with the upper surface of the ground conductor, and/or the lower surface of the graphite sheet is coplanar with the lower surface of the ground conductor. Side surfaces of the ground conductor are in contact with the graphite sheet.

Figure 11:
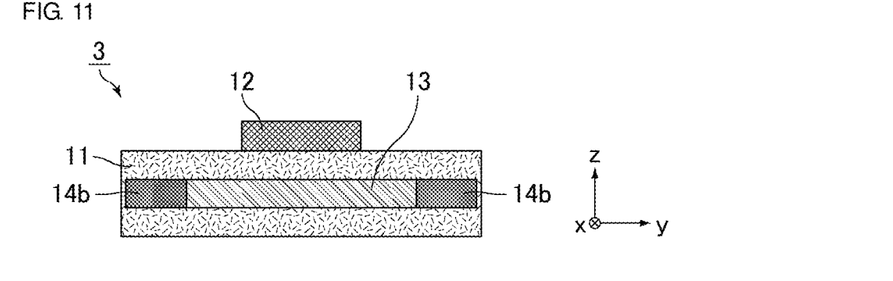
FIG. 11 is a sectional view of an example of a multilayer wiring substrate according to a third preferred embodiment of the present invention.

FIG. 11 is a sectional view of an example of the multilayer wiring substrate according to the third preferred embodiment of the present invention.

Figure 12A:
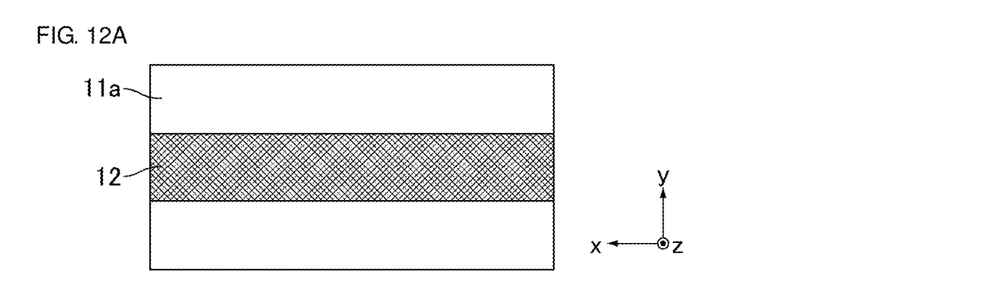
FIGS. 12A and 12B are exploded plan views of the multilayer wiring substrate illustrated in FIG. 11.
Figure 12B:
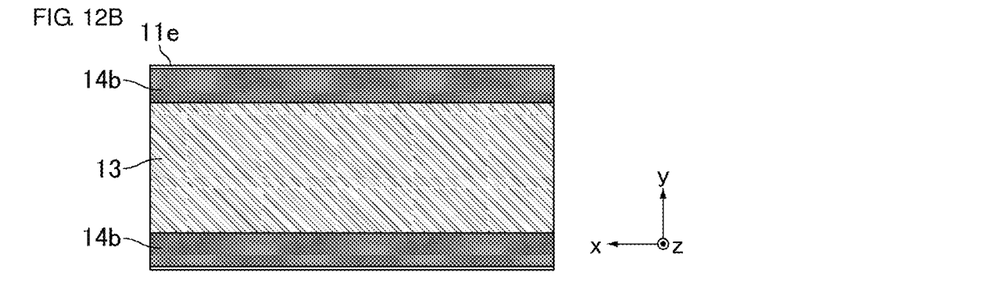

FIGS. 12A and 12B are exploded plan views of the multilayer wiring substrate illustrated in FIG. 11.

Referring to FIG. 11, a multilayer wiring substrate 3 includes a dielectric base body 11, a signal line 12, a ground conductor 13, and a graphite sheet 14b. The signal line 12 is provided on a surface of the dielectric base body 11, and the ground conductor 13 and the graphite sheet 14b are provided in the dielectric base body 11.

The dielectric base body 11 includes a dielectric sheet 11a (see FIG. 12A) and a dielectric sheet 11e (see FIG. 12B), which are in this order in the direction from the positive side to the negative side in the direction of the z axis and are bonded together into a laminate by pressure bonding.

The signal line 12 is provided on a front surface of the dielectric sheet 11a as illustrated in FIG. 12A, thus being located on the surface of the dielectric base body 11.

The ground conductor 13 is provided on the front surface of the dielectric sheet 11e as illustrated in FIG. 12B, thus being located in the dielectric base body 11.

The graphite sheet 14b is provided on the front surface of the dielectric sheet 11e as illustrated in FIG. 12B, thus being located in the dielectric base body 11. The graphite sheet 14b extends over a region being a portion of the front surface of the dielectric sheet 11e and being not overlaid with the ground conductor 13.

The multilayer wiring substrate 3 illustrated in FIG. 11 includes the following features. The upper surface of the graphite sheet 14b is coplanar with the upper surface of the ground conductor 13, and the lower surface of the graphite sheet 14b is coplanar with the lower surface of the ground conductor 13. Side surfaces of the ground conductor 13 are in contact with the graphite sheet 14b.

Although the second preferred embodiment provides a reduction in the overall thickness of the substrate as described above, the thickness of the multilayer wiring substrate according to the third preferred embodiment of the present invention may be reduced even further. As in the second preferred embodiment, the ground conductor and the graphite sheet face each other with no portion of the dielectric base body therebetween, and thus predetermined characteristics are able to be easily provided.

The multilayer wiring substrate according to the third preferred embodiment of the present invention may also include the following features. In the case that the upper surface of the graphite sheet is coplanar with the upper surface of the ground conductor, it is not required that the lower surface of the graphite sheet be coplanar with the lower surface of the ground conductor. In the case that the lower surface of the graphite sheet is coplanar with the lower surface of the ground conductor, it is not required that the upper surface of the graphite sheet be coplanar with the upper surface of the ground conductor.

The multilayer wiring substrate according to the third preferred embodiment of the present invention may be produced in the same or similar manner as the multilayer wiring substrate according to the first preferred embodiment of the present invention.

The multilayer wiring substrate 3 illustrated in FIG. 11 may, for example, be produced as follows. The dielectric sheet 11a including the signal line 12 formed thereon and the dielectric sheet 11e partially overlaid with the ground conductor 13 and including the graphite sheet 14b formed on the region being not overlaid with the ground conductor 13 are provided in this order and are bonded together into a laminate by application of heat.

The multilayer wiring substrate according to the third preferred embodiment of the present invention may also include an electronic component mounted on the dielectric base body. The electronic component is preferably connected to the ground conductor with a conductor via extending therebetween, for example. The electronic component included in the multilayer wiring substrate is preferably an active component connected to the ground conductor with a conductor via extending therebetween, for example.

The multilayer wiring substrate according to the third preferred embodiment of the present invention and the multilayer wiring substrate according to the second preferred embodiment of the present invention share the following feature. The ground conductor and the graphite sheet are in contact with each other such that heat generated by the electronic component connected to the ground conductor is transferred to the graphite sheet having high thermal conductivity. The conductor via may also provide a signal path to transmit signals to the ground conductor.

Figure 13:
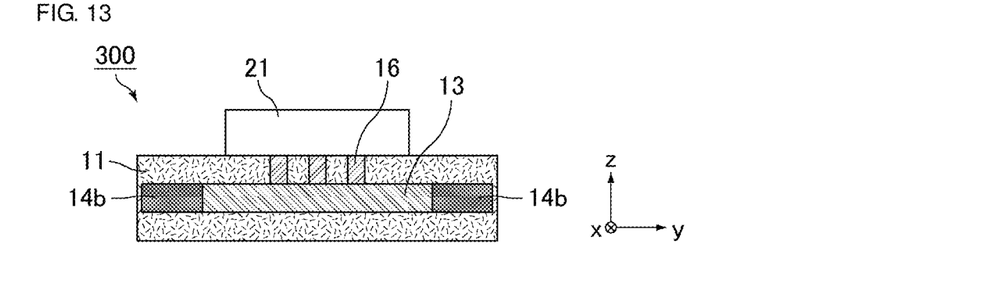
FIG. 13 is a sectional view of another example of the multilayer wiring substrate with an electronic component connected to the ground conductor of the multilayer wiring substrate.

FIG. 13 is a sectional view of another example of the multilayer wiring substrate with an electronic component connected to the ground conductor of the multilayer wiring substrate.

Referring to FIG. 13, which illustrates a multilayer wiring substrate 300, an electronic component, or more specifically, an active component 21 is mounted on a principal surface of the dielectric base body 11. The active component 21 is connected to the ground conductor 13 with conductor vias 16 extending therebetween.

As described above, the upper surface of the graphite sheet is coplanar with the upper surface of the ground conductor or is located below the upper surface of the ground conductor. However, the multilayer wiring substrate according to the present invention is not limited to the preferred embodiments above. With regard to the features of the multilayer wiring substrate and conditions for producing of the multilayer wiring substrate, various applications and alterations are possible within the scope of the present invention.

In the first and second preferred embodiments, the signal line and the ground conductor are closer than the graphite sheet to the one principal surface of the dielectric base body. The multilayer wiring substrate may also include a signal line and a ground conductor that are closer than the graphite sheet to the other principal surface of the dielectric base body. The signal line and the ground conductor that are closer to the other principal surface may be or may not be equal in size, structure, and location to the signal line and the ground conductor that are closer to the one principal surface.

In the third preferred embodiment, the signal line is closer than the ground conductor and the graphite sheet to the one principal surface of the dielectric base body. The multilayer wiring substrate may also include a signal line that is closer than the ground conductor and the graphite sheet to the other principal surface of the dielectric base body. The signal line closer to the other principal surface may be or may not be equal in size, structure, and location to the signal line closer to the one principal surface.

Although the upper surface and the lower surface of the graphite sheet of the multilayer wiring substrate are preferably located within the dielectric base body, for example, the upper surface or the lower surface of the graphite sheet may be exposed at a surface of the dielectric base body. In the third preferred embodiment, the upper surface or the lower surface of the ground conductor may be exposed at a surface of the dielectric base body.

It is not required that the upper surface of the signal line of the multilayer wiring substrate be located above the surface of the dielectric base body. That is, the signal line may be embedded in the dielectric base body.

The multilayer wiring substrate may also include the following features. In the case that the upper surface of the graphite sheet is coplanar with the lower surface of the ground conductor, it is not required that the lower surface of the ground conductor be in contact with the graphite sheet. In the case that the upper surface of the graphite sheet is coplanar with the upper surface of the ground conductor, and/or the lower surface of the graphite sheet is coplanar with the lower surface of the ground conductor, it is not required that the side surfaces of the ground conductor be in contact with the graphite sheet.

The multilayer wiring substrate according to preferred embodiments of the present invention may be a flexible substrate or a rigid substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer wiring substrate, comprising:
   a dielectric base body that is a laminate including a plurality of dielectric sheets stacked on top of each other;
   a signal line in or on the dielectric base body;
   a ground conductor in the dielectric base body, the ground conductor and the signal line facing each other in a stacking direction of the plurality of dielectric sheets, the ground conductor overlapping the signal line when viewed in plan in the stacking direction; and
   a graphite sheet in the dielectric base body, the graphite sheet and the signal line facing each other in the stacking direction without the signal line being located between the graphite sheet and the ground conductor; wherein
   the signal line is on an upper side in the stacking direction;
   the ground conductor is on a lower side in the stacking direction;
   an upper surface of the graphite sheet is coplanar with an upper surface of the ground conductor or is located below the upper surface of the ground conductor;
   an entirety of the graphite sheet is embedded inside of the dielectric base body such that no portion of the graphite sheet is exposed from the dielectric base body; and
   the graphite sheet is a graphene sheet including a plurality of layers of graphene stacked directly on one another.

2. The multilayer wiring substrate according to claim 1, wherein the upper surface of the graphite sheet is located below a lower surface of the ground conductor.

3. The multilayer wiring substrate according to claim 1, wherein at least a portion of the upper surface of the graphite sheet is in contact with the ground conductor.

4. The multilayer wiring substrate according to claim 3, wherein
   the graphite sheet includes a through-hole extending in the stacking direction;
   the through-hole is filled with a portion of the ground conductor; and at least a portion of a lower surface of the ground conductor is in contact with the dielectric base body.

5. The multilayer wiring substrate according to claim 1, wherein
the upper surface of the graphite sheet is coplanar with the upper surface of the ground conductor, and/or a lower surface of the graphite sheet is coplanar with a lower surface of the ground conductor; and
side surfaces of the ground conductor are in contact with the graphite sheet.

6. A multilayer wiring substrate, comprising:
a dielectric base body that is a laminate including a plurality of dielectric sheets stacked on top of each other;
a signal line in or on the dielectric base body;
a ground conductor in the dielectric base body, the ground conductor and the signal line facing each other in a stacking direction of the plurality of dielectric sheets, the ground conductor overlapping the signal line when viewed in plan in the stacking direction; and
a graphite sheet in the dielectric base body, the graphite sheet and the signal line facing each other in the stacking direction without the signal line being located between the graphite sheet and the ground conductor; wherein
the graphite sheet includes a through-hole extending in the stacking direction;
the signal line is on an upper side in the stacking direction;
the ground conductor is on a lower side in the stacking direction;
an upper surface of the graphite sheet is located below the upper surface of the ground conductor; and
a lower surface of the ground conductor is coplanar with the upper surface of the graphite sheet and is in contact with a portion of the upper surface of the graphite sheet and with the dielectric base body.

7. The multilayer wiring substrate according to claim 3, further comprising an electronic component mounted on the dielectric base body and connected to the ground conductor with a conductor via extending between the electronic component and the ground conductor.

8. The multilayer wiring substrate according to claim 1, wherein the upper surface and the lower surface of the graphite sheet are located in the dielectric base body.

9. The multilayer wiring substrate according to claim 6, wherein the upper surface and the lower surface of the graphite sheet are located in the dielectric base body.

10. The multilayer wiring substrate according to claim 7, wherein the conductor via is a thermal via, and the electronic component is an active component.

11. The multilayer wiring substrate according to claim 1, wherein the plurality of dielectric sheets include a first dielectric sheet, a second dielectric sheet, and a third dielectric sheet that are provided in order in the stacking direction.

12. The multilayer wiring substrate according to claim 11, wherein the signal line is on a surface of the first dielectric sheet that faces away from the second dielectric sheet.

13. The multilayer wiring substrate according to claim 11, wherein the ground conductor is on a surface of the second dielectric sheet that faces the first dielectric sheet.

14. The multilayer wiring substrate according to claim 11, wherein the graphite sheet is on a surface of the third dielectric sheet that faces the second dielectric sheet.

15. The multilayer wiring substrate according to claim 1, wherein a spacing between an upper surface of the graphite sheet and a lower surface of the ground conductor equal to or more than about 20% of a spacing between an upper surface of the ground conductor and a lower surface of the signal line.

16. The multilayer wiring substrate according to claim 1, wherein a thickness of the graphite sheet is between about 20 µm and about 80 µm.

17. The multilayer wiring substrate according to claim 1, wherein an electrical conductivity of the graphite sheet is between about 13,000 S/cm and about 20,000 S/cm.

18. The multilayer wiring substrate according to claim 1, further comprising:
another signal line; and
another ground conductor; wherein
the signal line and the ground conductor are closer than the graphite sheet to a first principal surface of the dielectric base body; and
the another signal line and the another ground conductor are closer than the graphite sheet to a second principal surface of the dielectric base body.

* * * * *